United States Patent [19]

Blackwood

[11] 4,197,000
[45] Apr. 8, 1980

[54] POSITIVE DEVELOPING METHOD AND APPARATUS

[75] Inventor: Robert S. Blackwood, Chanhassen, Minn.

[73] Assignee: FSI Corporation, Chaska, Minn.

[21] Appl. No.: 908,701

[22] Filed: May 23, 1978

[51] Int. Cl.$^2$ .............................................. B08B 3/02
[52] U.S. Cl. ................................... 354/323; 354/325; 134/95; 134/99; 134/140; 134/153; 134/199
[58] Field of Search ............... 354/311, 312, 315, 323, 354/324, 325, 326, 328, 329, 330; 206/454; 134/95, 99, 102, 103, 140, 149, 152, 153, 167, 168, 170, 171, 181, 199, 200

[56] References Cited

U.S. PATENT DOCUMENTS

| | | | |
|---|---|---|---|
| 3,489,608 | 1/1970 | Jacobs et al. | 134/149 |
| 3,604,331 | 9/1971 | Parlin et al. | 354/324 |
| 3,769,992 | 11/1973 | Wallestad | 134/153 |
| 3,812,514 | 5/1974 | Watabe | 354/325 |
| 3,846,818 | 11/1974 | Merz | 354/324 |
| 3,911,460 | 10/1975 | Lasky et al. | 354/328 |
| 3,923,156 | 12/1975 | Wallestad | 206/454 |
| 3,961,877 | 6/1976 | Johnson | 206/454 |
| 3,973,847 | 8/1976 | Gygax et al. | 354/325 |
| 3,990,088 | 11/1976 | Takita | 354/324 |
| 3,990,462 | 11/1976 | Elftmann et al. | 134/200 |
| 4,027,686 | 6/1977 | Shortes et al. | 134/153 |
| 4,081,816 | 3/1978 | Geyken et al. | 354/324 |

Primary Examiner—L. T. Hix
Assistant Examiner—Alan Mathews
Attorney, Agent, or Firm—H. Dale Palmatier

[57] ABSTRACT

A positive developer and method spraying developer solution against rotating wafers stacked along rotation axis to remove photoresist and recycling the developer solution in successive cycles and batches of wafers being processed; adding small quantities of fresh developer solution in each cycle of operation to replace the small quantity lost and rinsed down the drain at the end of each cycle, thereby maintaining the strength of the developer solution and equilibrium to establish a predetermined time per cycle needed for completing removal of photoresist; rinsing away the developer solution from the wafers and interior of the spray chamber with deionized water and subsequently applying heated nitrogen to accomplish drying of everything within the chamber.

19 Claims, 6 Drawing Figures 4,197,000

POSITIVE DEVELOPING METHOD AND APPARATUS

TECHNICAL FIELD

This invention relates to the processing of wafers during the manufacture of integrated circuits and more particularly to application of processing fluids to the wafers, such as in the developing stage wherein quantities of photoresist are being removed from the wafers which are usually silicon based material.

BACKGROUND OF PRIOR ART

In the prior art, the application of developer to wafers for the purpose of removing photoresist has been accomplished in principally two manners.

One of the common manners of developing or removing photoresist has been accomplished by spraying the photoresist onto one wafer at a time which is individually handled. The developer solution which is sprayed onto the single wafer carries away the photoresist which is removed and then the developer solution with the small quantity of photoresist is put down the waste drain and is forever lost.

Another principal method of applying the developer to such wafers is to provide a tank of developer solution in which the silicon base wafers are dipped so that the photoresist is removed in the tankful of developer solution. After the tankful of developer solution has been used with a certain number of wafers for the purpose of removing the photoresist, the entire tank of developer solution is simply dumped down the waste drain, and the tank is again filled with fresh solution and the dipping process again commences and continues.

In this dipping process of removing photoresist, the small quantities of photoresist removed from the wafers is accumulated in the developer solution and over a period of time, the quantities of photoresist build up to a significant level.

As the quantities of photoresist increase in the developer solution, the cycle time for each successive wafer or batch of wafers must be progressively increased because the developing capabilities of the developing solution are progressively decreased.

Typical of the photoresist used on the wafers are those manufactured and sold by Hunt Chemical Company, Palisades Park, New Jersey, and known as Hunts LSI Type II; and those manufactured and sold by Shipley Chemical Company of Newton, Massachusetts, and known as Shipley 1350 B, Shipley 1350 J, and Shipley 1370.

Typical of the developing solutions which are commonly used for removal of such photoresist are sold by said Hunt Chemical Company, known as Hunts LSI Type II; and are sold by said Shipley Chemical Company and known as Shipley AZ 350.

BRIEF SUMMARY OF THE INVENTION

The present invention relates to a wafer processing apparatus and more particularly to positive developer apparatus and method of developing and removing photoresist from wafers in the processing of such wafers during the manufacture of integrated circuits and the like. Applicant has stacked a batch of wafers in spaced relation to each other and along the axis of rotation of the wafers confined in a closed spray chamber. A plurality of nozzles adjacent the chamber wall direct fan sprays of processing fluid such as reused and recycled developer solution toward the rotation axis and across the spaced wafers as they are revolved. In this way, the photoresist is loosened and swept away from the faces of the wafers.

Of course, the quantity of photoresist is carried by the recycled developer solution. At the end of each cycle of spraying developer solution onto a batch of such wafers, a small quantity of the developer solution will remain on the wafers and on the rotor carrying the wafers and otherwise on the interior surfaces of the spray chamber. The drain from the spray chamber is then reconnected by a valve so that solution from the chamber will no longer be returned to the developer solution reservoir, but the drained solution from the spray chamber will thereafter be directed to a waste drain so that the rinsing solution, usually deionized water, will be swept away to the waste drain, carrying with it whatever small quantities of developer solution may have remained in the spray chamber. Subsequently, drying nitrogen gas will be introduced into the spray chamber after the rinsing with deionized water has been completed as to dry the wafers, the rotor carrying the wafers, and all other interior surfaces of the spray chamber.

The complete rinsing of the wafers, together with the rotor carrying the wafers and all other interior surfaces of the spray chamber specifically clears away any residues of the developer solution and absolutely minimizes the problem of alkaline salt residue build-up which, but for the rinsing and drying cycle, would be likely to build up in the spray chamber because of the sodium hydroxide base of the developer solution.

The quantity of developer solution lost during the processing of each batch of wafers is replaced by a like amount of fresh developer solution. It has been found that by adding the quantity of fresh solution to replace that quantity of developer solution remaining on the wafers, rotor, and bowl walls at the end of each cycle produces substantially a condition of equilibrium in the developer solution so that only an acceptable minimal time for each developing cycle per batch of wafers is expended. In the event that the equilibrium condition of the developer is exceeded during successive cycles, and it is desired to drain off and replace larger quantities of the developer solution with fresh developer, the valve at the drain from the spray chamber may be operated slightly before the end of the operating cycle so that a greater quantity of the developer solution is directed to the waste drain instead of being recirculated to the developer reservoir.

DETAILED DESCRIPTION OF THE INVENTION

One form of the present invention is illustrated in FIGS. 1-5 hereof and is described herein.

Figure 1:
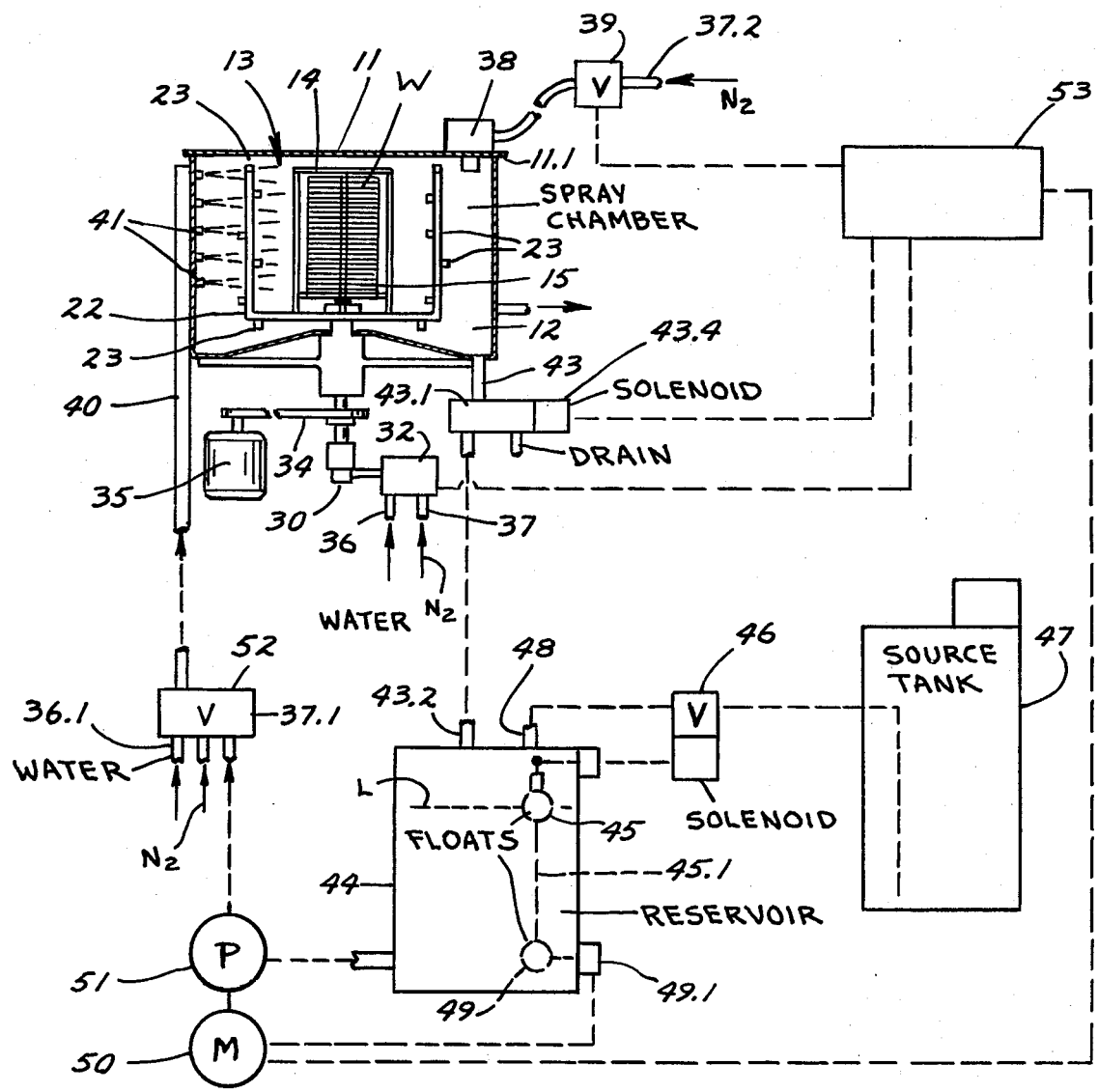
FIG. 1 is a diagrammatic sketch of the entire apparatus by which the present invention is carried out.

The apparatus illustrated in FIG. 1 includes a bowl-shaped housing 10 having a cover 11 and defining a closed spray chamber 12 within the housing. A rotor in the housing is indicated in general by numeral 13 and includes a cage-like enclosure or skeletal rotor 14 constructed of rod material for confining a plastic basket 15 which confines a multiplicity of wafers W in stacked, but spaced relation to each other. The basket 15 is substantially of the type described and illustrated in U.S. Pat. No. 3,923,156 and has a multiplicity of interior ribs and grooves which maintain the wafers W in separated relation with respect to each other.

Figure 4:
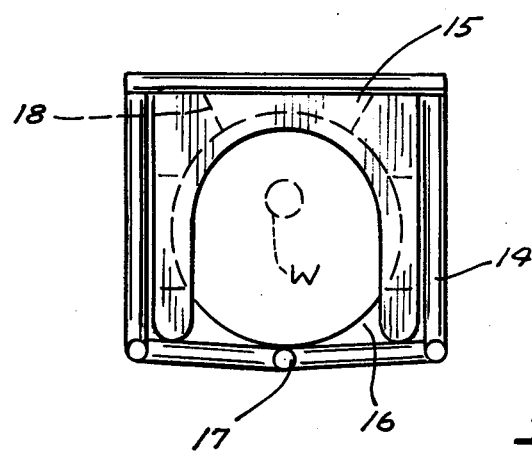
FIG. 4 is a top plan view of the central portion of the rotor.
Figure 2:
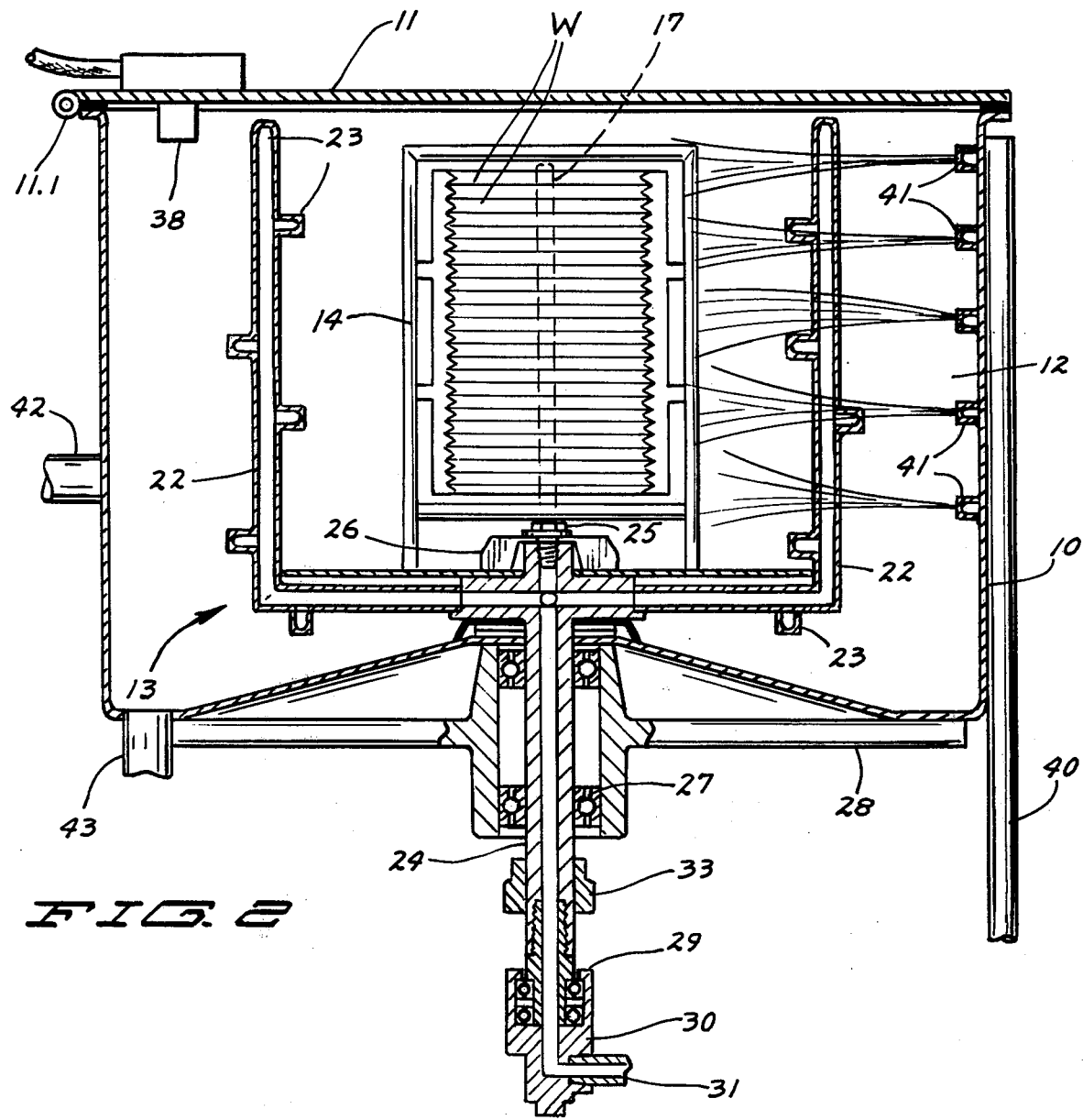
FIG. 2 is a detail section view of the spray chamber with the wafer carrying rotor.
Figure 3:
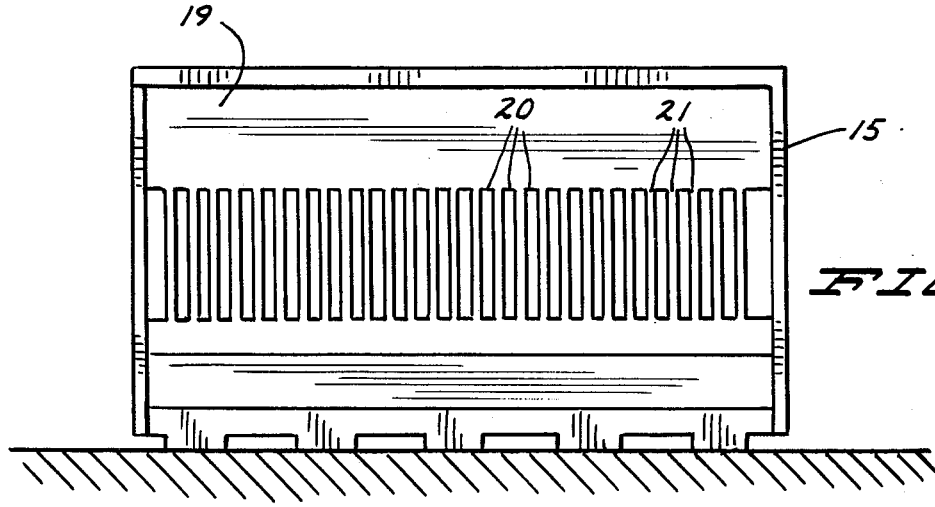
FIG. 3 is a side elevation view of a typical wafer carrying basket confined and rotated with the rotor.

As illustrated in FIG. 4, the basket 15 is also of skeletal construction and has one open side at 16 which is often considered the top of the basket through which the wafers are loaded into the basket. However, in the arrangement on rotor 14, the open front side 16 of the basket is obstructed by a vertical rod 17 which is a part of the cage-like enclosure 14 so as to retain the wafers W in the basket.

The basket 15 also has an open bottom indicated at 18 to allow free access to the wafers from the bottom side of the basket. Additionally, the two sidewalls 19 of the basket have a multiplicity of slots 20, one between each pair of wafers in the basket, to permit entry of spray solution to the sides of the wafers. Each of the slots are separated by ribs 21, interior extensions of which form the separators between adjacent wafers W.

The rotor 13 also includes a plurality of manifold pipes 22 spaced outwardly from the cage-like enclosure 14, but also in spaced relation with the peripheral wall of the housing. The manifold pipes 22 have a plurality of spray nozzles 23 variously located and oriented in various directions so that the cumulative effect of the spray which emanates from the several nozzles 23 is to direct liquid spray therefrom against all portions of the cage-like enclosure 14 and all other portions of all interior surfaces of the housing 10.

The cage-like enclosure 14 facilitates outward swinging of the vertical rod 17 as to permit the basket 15 to be released for removal, and the enclosure 14 is affixed as by welding to the manifold pipes 22 so that the entire rotor 13 is substantially integral and in one piece.

The rotor 13 also includes a tubular mounting shaft 24, the hollow interior of which is in flow communication with the manifold pipes 22, and the end of which is closed by a cap screw 25 adjacent retainer nut 26. The tubular mounting shaft 24 is carried in a bearing structure 27 on the frame portion 28 of the housing.

The lower end of the tubular shaft is carried in a suitable bushing arrangement 29 providing for connection of the shaft 24 in flow communicating relation to a fitting 30 so as to facilitate connecting the fitting and shaft 24 by a conduit 31 to a control valve 32.

A drive pulley 33 on the tubular shaft 24 is connected by a belt drive 34 to a motor 35 for revolving the rotor 13.

Valve 32 controls the flow of fluid through the manifold pipes 22 and is a multi-position valve, either closing off flow entirely, or alternately connecting the conduit 31 and shaft 24 to a source of deionized water at inlet 36 or to a source of nitrogen gas as indicated at inlet 37.

Heated nitrogen may also be introduced into the chamber 12 from a nozzle 38 mounted on the cover 11 and controlled by another valve 39.

Another manifold pipe 40 extends upwardly along the housing sidewall and has a plurality of nozzles 41 thereon and extending into the spray chamber 12 of the housing. The nozzles 41 are of the type to produce a fan type spray so that developer solution sprayed thereby will drench the wafers W rotating on rotor 13.

The housing 10 has an exhaust duct 42 through which the exhaust gases from the spray chamber 12 are drawn. A drain conduit 43 is provided at the bottom of the housing 10 through which the liquid materials sprayed into the spray chamber will be drawn off.

A reservoir tank 44 contains a supply of developing solution, and particularly developing solution which has been recycled and reused, and contains a small quantity of the photoresist. The photoresist is maintained at level L in the reservoir tank 44, and at the end of each operating cycle, the float 45 in the reservoir is effective to operate a valve 46 through which a fresh supply of photoresist is directed from a source tank 47 of fresh photoresist. The source tank 47 may be under pressure so as to cause the fresh developer solution to flow through valve 46 and duct 48 when the valve is open. The float 45 may be adjustable along an upright stem 45.1 so that a desired level of developer solution may be maintained in the reservoir.

A second low level float 49 is also provided in the reservoir to shut down the motor 50 of pump 51 which draws the developer solution from the reservoir and directs the solution through valve 52 and into the manifold pipe 40 for spraying onto the wafers in the chamber.

Normally the float switch 49.1 allows the motor to operate in accordance with the master control circuitry by which the normal cycling of pump 51 and the several valves is controlled.

The valve 52 alternately connects the manifold pipe 40 to the pump 51 which delivers the developer solution under pressure; or the valve 52 may connect the manifold pipe 40 to a duct 36.1 which is a source of deionized rinsing water; or alternately the valve 52 may connect the manifold pipe 40 to a duct 37.1 which is a source of heated nitrogen for drying purposes after the completion of a rinsing cycle.

In an operating cycle, the wafers will be confined in the basket 15 which is then placed in the cage-like enclosure 14 of the rotor. By virtue of the open top and bottom of the basket 15, and the slots 20 at the sidewalls, access is provided to substantially all the edge portions of the wafers W carried on the revolving rotor. Motor 50 and pump 51 are operated so as to draw the reused developer solution from the reservoir 44 and direct the solution under substantial pressure through the manifold pipe 40 and nozzles 41.

Simultaneously, motor 35 is operated so as to revolve the rotor and wafers which are being sprayed. The rotor will revolve at any of a number of speeds, depending upon the speed desired and that of motor 35, and the rotor may revolve in the range of 300 to 800 rpm. Because the wafers W are rotating with the rotor, and because the source of spray at nozzles 41 is stationary, the developer solution is continuously applied during each cycle of rotation of the rotor to all edge portions of the wafers. Simultaneously with application of spray to the wafers, the centrifugal force spins the solution off the faces of the wafers, carrying the photoresist with the developer solution. The developer solution with the photoresist loosened from the wafers is collected in the lower sump area of the housing 10 and is directed downwardly through the drain conduit 43 and through the valve 43.1 and duct 43.2 to be returned to the reservoir 44.

The reservoir 44 may be of such size as to hold approximately 3,000 to 5,000 milliliters of solution. The pump P will pump approximately 2,000 to 4,000 milliliters per minute; and the normal cycling time of application of developer solution to the wafers will be approximately 30 to 90 seconds, and within this range, a 60 second cycle is typical.

When the spraying cycle is completed, the main control apparatus 53 will shut down the pump motor 50 and the developer solution in the housing 10 will substantially completely collect in the sump area of the housing and complete its drainage back to the reservoir 44.

There will be a small quantity of developer solution retained on the wafers W and on the rotor 13 and on the interior surfaces of housing 10 and cover 11. It has been experienced that the quantity retained within the housing 10 may be in the range of 150 milliliters. Accordingly, the level L of developer solution in the reservoir 44 will be slightly lower than previously, and the float 45 will thereby be effective to operate valve 46 and allow an additional quantity of fresh developer solution to be supplied into the reservoir. The same quantity that had been left in the spray housing 10, approximately 150 milliliters, will be supplied from the source 47 into the reservoir 44, after which the float 45 will again operate the valve to close the connection from the source to the reservoir.

Immediately upon the completion of the cycle spraying developer solution from nozzles 41 onto the wafers W, the valve 43.1 is operated so as to thereafter connect the drain duct 43 to the waste drain pipe 43.4. This operation of the valve 43.1 is accomplished by the main control system 53 through operation of a valve solenoid 43.5 or other similar operating media.

As the spraying of developer solution is completed, valve 32 and valve 52 are operated as to direct deionized water through the manifold pipes 22 of the rotor and the manifold pipe 40, thereby supplying nozzles 23 and 41 with deionized water so as to rinse the wafers W and all of the portions of the rotor 13 as it revolves as well as the entire surface area of the housing 10. All of the developer solution which may have collected in small amounts at various locations in the chamber is thereby rinsed away and caused to travel through the drain duct 43 and down through the waste drain 43.4.

After a period of rinsing, the valves 32 and 52 are again operated to terminate flow of water through the rotor of manifold pipes 22 and manifold pipe 40. Immediately after the rinsing phase is completed, the master control 53 causes operation of valves 32 and 52 again, and also valve 39 to cause heated nitrogen to be introduced into the chamber 12 for drying all of the wafers W and all of the other surfaces including the interior walls of the housing and all of the rotor pipes and parts. Upon completion of drying through the use of heated nitrogen gas in the spray chamber, the basket 15 is loosened from the cage-like enclosure 14 of the rotor and the basket of wafers is thereupon entirely removed from the spray chamber after the cover 11 has been opened at its hinge 11.1.

Figure 5:
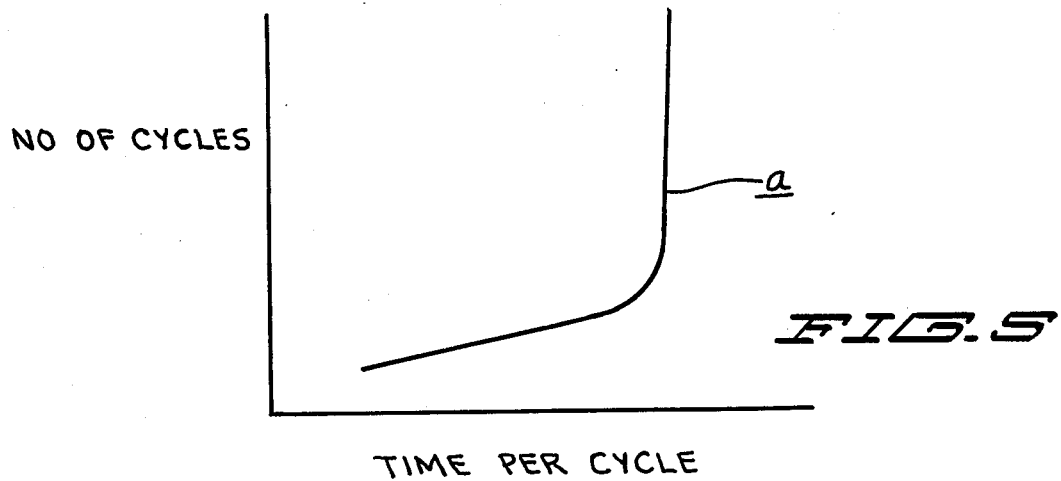
FIG. 5 is a graph indicating capability of the recycled developer solution utilized.

The recycling of the developer solution is particularly effective and useful with certain types of developer solution such as the Hunt Chemical developer solution LSI Type II which reaches a state of equilibrium as is indicated by the upright portion a of the curve illustrated in FIG. 5. When this state of equilibrium is reached, simply by adding approximately 150 milliliters of solution for each operating cycle, will maintain the developer solution at a proper strength to accomplish the necessary developing and loosening and removal of the photoresist. Under these circumstances it is not necessary to replace the entire quantity of developer solution at any time. In the event that a somewhat larger quantity of developer solution need be replaced at each cycle of operation, the valve 43.1 may be simply operated slightly sooner in the operating cycle by the master control mechanism 53 in relation to the shut-down moment of the pump 51 and motor 50. This will cause a slightly greater quantity of developer solution to be washed down the waste drain 43.4. Similarly another method by which a greater percentage of the developer solution may be changed in each operating cycle is to reduce the stored quantity of developer solution in the reservoir 44, and accordingly, removal of the same physical quantity of developer solution, to-wit, that amount remaining on the wafers and on the other surfaces of the rotor and interior surfaces of the housing, will constitute a larger percentage of the total available supply of recyclable developer solution.

In initially determining the quantity of developer solution which is required in this operating cycle and which is necessarily removed in each operating cycle, can be computed by knowing the thickness of the photoresist on the wafer, the developed area on the wafer, in percentage of total area; the size or diameter of the wafer; the volume of the reservoir or recirculating tank, and particularly the number of ounces of recirculated solution; the amount of reciruclated developer solution lost in each cycle, in terms of thepercentage of the total volume of the reservoir; the amount of fresh developer solution to be added to replace that solution which has been lost, in terms of percentage of the volume of the reservoir; and also knowing the equilibrium point of the recirculated developer solution, to-wit, that point at which the developing rate does not change.

The method or process also comprising a part of the invention, includes, in the art of developing and removing photoresist from wafers in the processing of such wafers during manufacture of integrated circuits and the like, the method steps consisting in stacking a plurality of wafers in a batch and in spaced relation to each other along and transversely of a rotation axis in a closed spray chamber, simultaneously revolving the wafers on the axis and directing a spray of developer solution transversely of the axis and across the stacked wafers, recovering the developer solution in a reservoir for recirculation to the spray again, upon completion of spraying of the developer solution causing the rinsing away of the quantity of developer solution remaining on the wafers and otherwise in the spray chamber, adding fresh developer to the reservoir in an amount equaling the quantity rinsed away, and reusing the developer in the reservoir on successive batches of wafers. This method is further detailed in that the rinsing away of developer and the adding of fresh developer are balanced in amounts to maintain a state of equilibrium in the developing capabilities of the reused developer solution. The method is further detailed in regard to the complete rinsing of the wafers and of the rotor and all interior surfaces of the spray chamber with deionized water or other suitable liquid, followed by drying of the wafers and the interior surfaces of the housing and of the rotor through the use of heated nitrogen gas.

Figure 6:
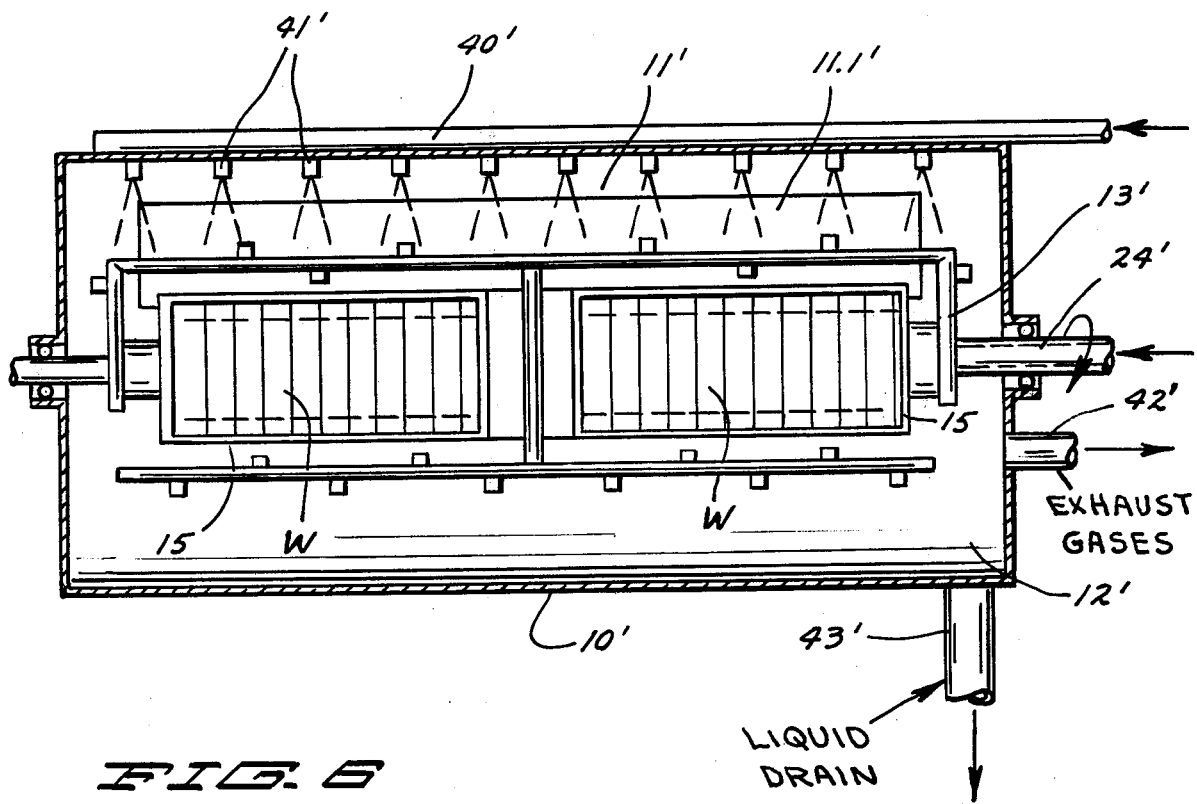
FIG. 6 is a generally diagrammatic sketch of an alternative form of spray chamber and rotor.

In the form of the invention illustrated in FIG. 6, a modified form of spray chamber and rotor is illustrated.

In this form, the rotor is indicated by numeral 13' and is oriented on a horizontal axis in contrast to the vertical axis of rotation in the form illustrated in FIGS. 1-5. One of the mounting shafts 24' is tubular and supplies rinsing water or drying gas to the manifold pipes 22' of the rotor. The stacked wafers W are again carried in the baskets 15, but the elongate baskets 15 are oriented horizontally so that the wafers W are spaced along and oriented transversely of a horizontal axis of rotation of the rotor. The housing 10' which confines the rotor is substantially cylindrical and has an access opening 11' and a closure 11.1', allowing access into the interior chamber 12' of the housing. Manifold pipe 40' supplies developer solution to the nozzles 41', when the controlling valve is operated, either rinsing water or drying nitrogen gas may be supplied through the manifold pipe 40' and nozzles 41'. Suitable exhaust duct 42' and a liquid drain 43' are also provided for the housing.

In all other respects, the form illustrated in FIG. 6 will operate substantially the same as the form illustrated in FIGS. 1-5. In this arrangement, the rotor may alternately be extended so as to carry additional baskets 15 full of wafers W to increase the capacity, per cycle of the machine.

Statement of Industrial Application

This invention is useful in the production and processing of wafers and substrates used in the manufacture of integrated circuits for the purpose of removing photoresist from the wafers and controlling the developing time per cycle by maintaining the developer solution at a predetermined equilibrium condition.

What is claimed is:

1. A positive developer apparatus for removal of photoresist from wafers being processed during manufacture of integrated circuit chips and the like, comprising
    a closed housing defining an interior spray chamber and having an access opening with a cover, the housing having means exhausting gases and draining liquids and including a drain conduit,
    a rotor in the spray chamber carrying a plurality of the wafers spaced from each other and oriented transversely of the rotation axis, the rotor carrying the wafers on the rotation axis,
    a plurality of developer spray nozzles in the spray chamber and directed toward the rotor for spray applying developer onto the wafers,
    a reservoir for developer,
    means directing developer from the reservoir to the spray nozzles under pressure,
    a source of fresh developer connected through a fresh developer valve to the reservoir, and
    valve and conduit means connecting the drain conduit to the reservoir for recycling the developer and alternately connecting the drain conduit to a disposal drain.

2. The positive developer apparatus according to claim 1 and the rotor having revolving manifold duct and nozzle means to spray and rinse interior surfaces of the spray chamber and also the rotor.

3. In the art of developing and removing photoresist from wafers in the processing of such wafers during manufacture of integrated circuits and the like, the method steps consisting in
    stacking a plurality of wafers in a batch and in spaced relation to each other along and transversely of a rotation axis in a closed spray chamber,
    simultaneously revolving the wafers on the axis and directing a spray of developer transversely of the axis and across the stacked wafers,
    recovering the developer in a reservoir for recirculation to the spray again,
    upon completion of the spraying of developer, rinsing away the quantity of developer remaining on the wafers and otherwise in the spray chamber,
    adding fresh developer to the reservoir in an amount equaling the quantity rinsed away, and
    reusing the developer in the reservoir on successive batches of wafers.

4. The method set forth in claim 3 and the rinsing away of developer and adding of fresh developer being balanced in amounts to maintain a state of equilibrium in the developing capabilities of the reused developer.

5. Apparatus for applying processing fluids to wafers in the manufacture of integrated circuit chips and the like, comprising
    a closed housing defining an interior spray chamber,
    a plurality of nozzles in the housing and being spaced outwardly from a rotation axis and also spaced from each other in a direction parallel to the axis, the nozzles being directed transversely of and substantially toward the axis and the nozzles having manifold means supplying processing fluid thereto under pressure, and
    an elongate wafer-carrying rotor in the housing and extending along the rotation axis, the rotor revolving on said axis and relative to the nozzles, the rotor having confining means retaining a plurality of such wafers in spaced relation from each other and in a stack along the axis, the confining means orienting the wafers transversely of and intersecting the axis and providing access to significant peripheral portions of all of the wafers by the sprayed fluids from the nozzles for applying processing fluids onto both sides of each of the wafers revolving with respect to the nozzles.

6. The fluid-applying apparatus according to claim 5 and the nozzles being stationary with the housing.

7. The fluid-applying apparatus according to claim 5 and the housing having a sidewall, the nozzles being disposed adjacent the sidewall of the housing and spaced along a manifold pipe lying adjacent the sidewall.

8. The fluid-applying apparatus according to claim 5 and the axis extending centrally through the rotor and through the confining means thereof to extend endwise through the stack of wafers.

9. The fluid-applying apparatus according to claim 5 wherein the rotation axis of the rotor is oriented substantially vertically.

10. The fluid-applying apparatus according to claim 5 and the rotation axis of the rotor being oriented substantially horizontally.

11. The fluid-applying apparatus according to claim 5 and the confining means on the rotor including a carrier removably mounted on the rotor with the axis extending through the carrier to intersect the wafers.

12. The fluid-applying apparatus according to claim 11 and the confining means including a second carrier on the rotor and spaced along the rotation axis from said first mentioned carrier.

13. The fluid-applying apparatus according to claim 11 and the rotor having a cage-like enclosure embracing the carrier and allowing open access to the sprayed fluids from the nozzles.

14. The fluid-applying apparatus according to claim 5 and including means delivering a measured quantity of processing fluid to the manifold means for spraying onto the wafers on the rotor.

15. The fluid-applying apparatus according to claim 5 and including means alternately supplying processing fluid and other fluids to the manifold means to be sprayed onto the wafers.

16. The positive developer apparatus according to claim 1 and including means sensing and producing an indication of the quantity of developer remaining on the wafers and on the housing rotor and nozzles upon completion of spraying and means responding to said indication to replenish the fresh developer valve to replenish the developer in the reservoir.

17. Apparatus for applying processing fluids to wafers in the manufacture of integrated circuit chips and the like, comprising
a closed housing defining an interior spray chamber,
a plurality of nozzles in the housing and being spaced outwardly from a rotation axis and spaced from each other in a direction parallel to the axis, the nozzles being directed transversely of and substantially toward the axis, and the nozzles having manifold means supplying processing fluid thereto, and
elongate skeletal means in the housing and extending endwise along the axis and adjacent the nozzles, the skeletal means retaining the wafers in spaced relation to each other and in a stack along the axis and maintaining the wafers oriented transversely of and intersecting the axis and providing access to significant peripheral portions of all of the wafers by the sprayed fluids from the nozzles to apply processing fluids onto both sides of each of the wafers, and means mounting the nozzles and skeletal means for relative rotation about the axis during spraying of fluids from the nozzles.

18. In the art of applying processing fluids to wafers in the manufacture of integrated circuits and the like, the method steps consisting in
stacking a plurality of wafers in a batch and in spaced relation to each other on and transversely of a rotation axis in a closed spray chamber,
simultaneously directing a spray of processing fluid toward the wafers and in a direction generally transversely of the axis and across and between the spaced wafers in the stack, and
producing relative rotation between the stacked wafers and the sprays directed across the wafers and about the axis.

19. The method according to claim 18 and also revolving the wafers about the axis which extends through all of the spaced wafers to spin excess fluid off the faces of the wafers.

* * * * *